US012803518B2

(12) United States Patent
Rieh et al.

(10) Patent No.: US 12,803,518 B2
(45) Date of Patent: Nov. 17, 2026

(54) INPUT/OUTPUT MATCHING CIRCUIT AND BROADBAND AMPLIFIER INCLUDING THE SAME

(71) Applicant: KOREA UNIVERSITY RESEARCH AND BUSINESS FOUNDATION, Seoul (KR)

(72) Inventors: Jae Sung Rieh, Seoul (KR); Woo Yong Keum, Seoul (KR); Do Yoon Kim, Suwon-si (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 412 days.

(21) Appl. No.: 18/538,185

(22) Filed: Dec. 13, 2023

(65) Prior Publication Data

US 2024/0195380 A1 Jun. 13, 2024

(30) Foreign Application Priority Data

Dec. 13, 2022 (KR) ........................ 10-2022-0173225

(51) Int. Cl.
*H03H 7/38* (2006.01)
*H03F 1/56* (2006.01)
*H03F 3/45* (2006.01)

(52) U.S. Cl.
CPC ................. *H03H 7/38* (2013.01); *H03F 1/56* (2013.01); *H03F 3/45475* (2013.01); *H03F 2200/222* (2013.01)

(58) Field of Classification Search
CPC ......... H03H 7/38; H03F 1/56; H03F 3/45475; H03F 2200/222
USPC .......................................................... 330/252
See application file for complete search history.

(56) References Cited

U.S. PATENT DOCUMENTS

| | | | | |
|---|---|---|---|---|
| 2018/0123551 A1 | 5/2018 | Pye | | |
| 2021/0391853 A1* | 12/2021 | Jann | ......................... | H03B 5/12 |
| 2023/0261615 A1* | 8/2023 | Jee | ......................... | H03F 1/0288 330/124 R |

FOREIGN PATENT DOCUMENTS

| | | | | |
|---|---|---|---|---|
| CN | 213585710 U * | 6/2021 | | |
| WO | WO-2024123223 A1 * | 6/2024 | ............. | H03F 3/245 |

OTHER PUBLICATIONS

Korean Office Action issued on Dec. 17, 2024, in connection with the Korean Patent Application No. 10-2022-0173225, with its machine English translation, 7 pages.

* cited by examiner

*Primary Examiner* — Hafizur Rahman
(74) *Attorney, Agent, or Firm* — Hauptman Ham, LLP

(57) ABSTRACT

Disclosed are an input/output matching circuit and a broadband amplifier including the same. A matching circuit connected to each of an input terminal and an output terminal of an amplifier includes: a coupled line circuit unit constituted by coupled lines having a 4-port structure, in which the coupled line includes a first metal line and a second metal line; and a first impedance restriction circuit unit connected to a through port among 4 ports of the coupled line, and restricting an even mode impedance in a low frequency band.

3 Claims, 7 Drawing Sheets

100

(a)

(b)

INPUT/OUTPUT MATCHING CIRCUIT AND BROADBAND AMPLIFIER INCLUDING THE SAME

CROSS-REFERENCE TO RELATED APPLICATION

The present application claims priority to Korean Patent Application No. 10-2022-0173225, filed Dec. 13, 2022, the entire contents of which is incorporated herein for all purposes by this reference.

BACKGROUND

(a) Technical Field

The present invention relates to an input/output matching circuit having a coupled line with a low resistance characteristic and a broadband amplifier including the same.

(b) Background Art

In recent telecommunications systems, a keyword is ultra-fast large data transmission. Ultra-high frequency communication systems such as 5G communication and 6G communication have an advantage of being able to increase the data transmission rate using a wide bandwidth, but it is difficult to design a circuit with a wide range of operating bandwidth.

In order to implement this as a monolithic microwave integrated circuit (hereinafter referred to as MMIC), a wide range of operating bandwidth is essential. Among various blocks needed for MMIC-based systems, the amplifier is a key block that determines the overall operating bandwidth of the system. This is because the amplifier is generally a forefront circuit for both a transmitter and a receiver.

Traditionally, distributed amplifier (DA) topology is widely used in various broadband system applications due to flat gains and proper matching properties.

However, a distributed amplifier structure is generally difficult to apply in small and low power applications because of its large size and power consumption due to the requirements for long transmission lines and extensive transistor stages.

Therefore, a variety of approaches are proposed as an alternative to expand the motion bandwidth, but due to the characteristics of the narrowband input/output matching, a bandwidth achieved by these techniques does not meet the distributed amplifier.

SUMMARY OF THE DISCLOSURE

It is an object of the present invention to provide an input/output matching circuit having a coupled line with a low resistance characteristic and a broadband amplifier including the same.

It is another object of the present invention to provide a broadband matching device which lowers characteristic resistance in a wide frequency band by using a coupled line, and amplifier including the same.

According to an aspect of the present invention, provided are an input/output matching circuit having a coupled line with a low resistance characteristic and a broadband amplifier including the same.

According to an embodiment of the present invention, a matching circuit connected to each of an input terminal and an output terminal of an amplifier may be provided, which includes: a coupled line circuit unit constituted by coupled lines having a 4-port structure, in which the coupled line includes a first metal line and a second metal line; and a first impedance restriction circuit unit connected to a through port among the 4 ports of the coupled line, and restricting an even mode impedance in a low frequency band.

According to another embodiment of the present invention, a differential amplifier may be provided, which includes: two input terminals having a differential structure; an amplification circuit unit amplifying signals of the two input terminals; at least one output terminal outputting the signals amplified by the amplification circuit unit; and a plurality of matching circuit units constituted by coupled lines having a 4-port structure, and connected to the two input terminals and the output terminal, respectively, and restricting an input/output impedance, in which each of the plurality of matching circuit units includes a resistance connected to a through port among the 4 ports of the coupled line, and a capacitor positioned between the coupled lines.

According to an embodiment of the present invention, an input/output matching circuit having a coupled line with a low resistance characteristic, and a broadband amplifier including the same are provided to lower characteristic resistance in a wide frequency band.

DETAILED DESCRIPTION

A singular form used in the present specification may include a plural form unless the context clearly dictates otherwise. In the present specification, a term such as "comprising" or "including" should not be interpreted as necessarily including all various components or various steps disclosed in the present specification, and it should be interpreted that some component or some steps among them may not be included or additional components or steps may be further included. In addition, the terms including "part", "module", and the like disclosed in the specification mean a unit that processes at least one function or operation and this may be implemented by hardware or software or a combination of hardware and software.

Hereinafter, an embodiment of the present invention will be described in detail with reference to the accompanying drawings.

Figure 1:
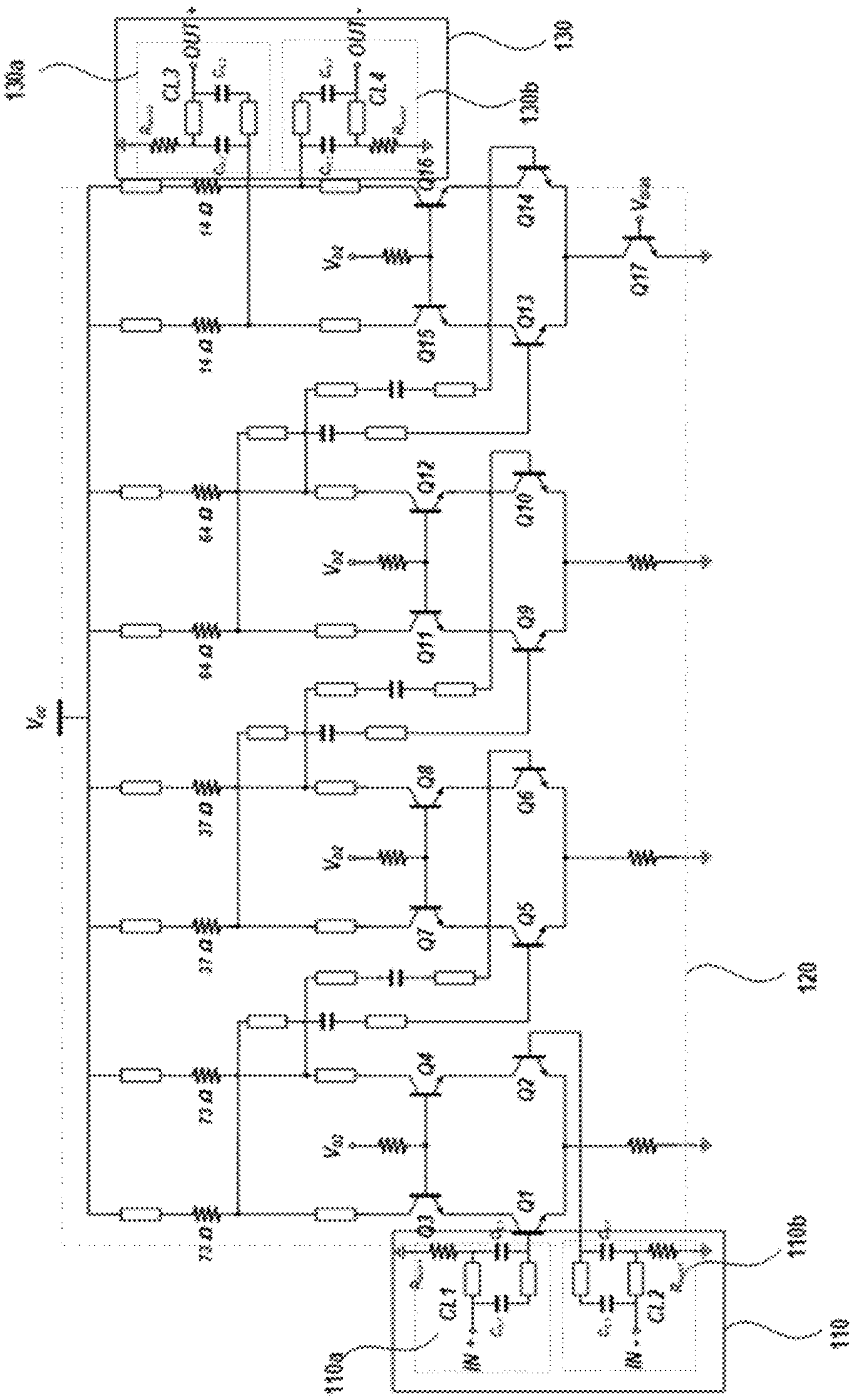
FIG. 1 is a circuit diagram illustrating a broadband amplifier having a coupled line with a low resistance characteristic according to an embodiment of the present invention.
Figure 2:
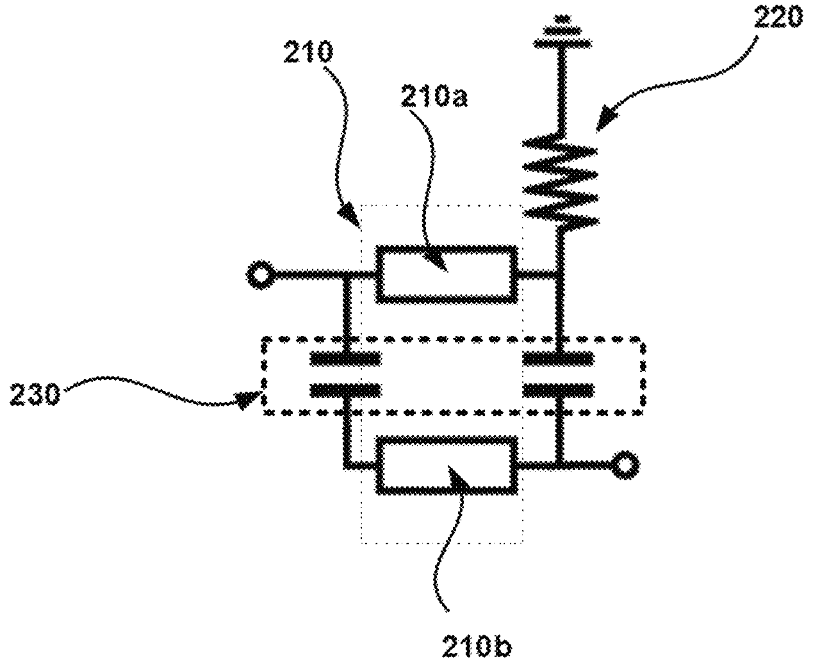
FIG. 2 is a diagram illustrating a detailed configuration of a matching circuit unit according to an embodiment of the present invention.
Figure 3:
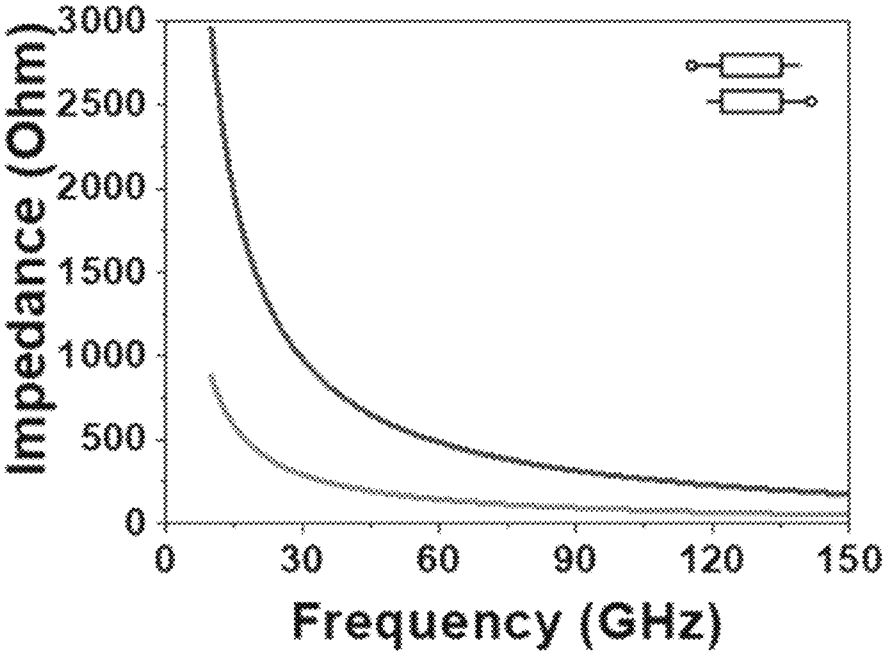
FIG. 3 is a diagram illustrating an impedance change when a resistance is connected to a coupled line according to an embodiment of the present invention.
Figure 3:
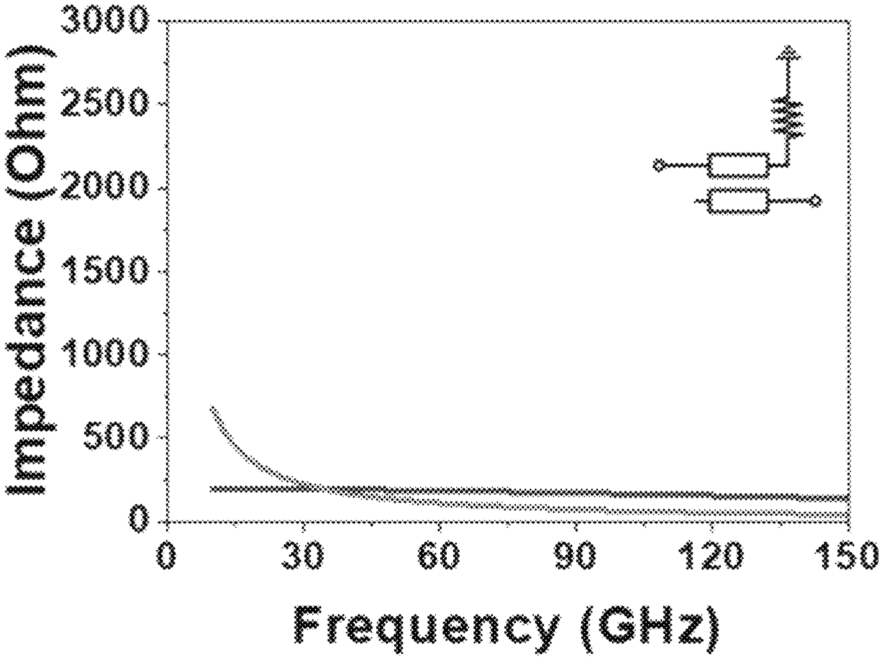
Figure 4:
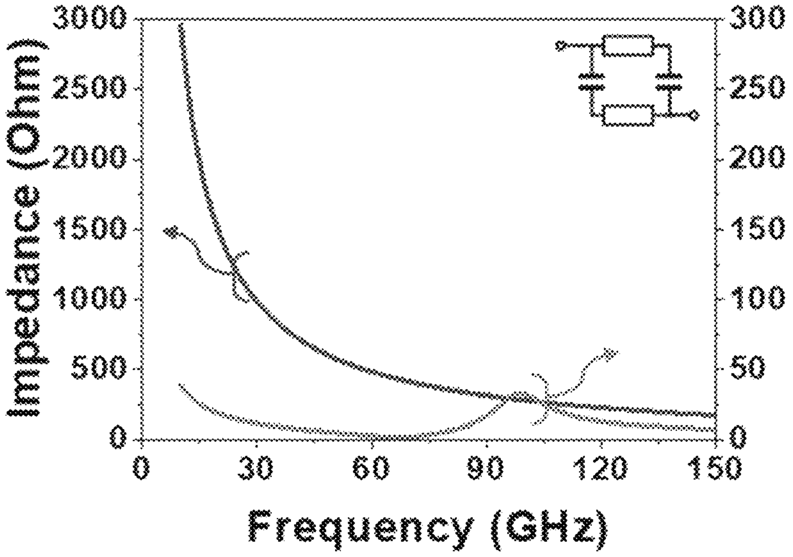
FIG. 4 is a diagram illustrating an impedance change when a capacitor is connected to the coupled line according to an embodiment of the present invention.
Figure 5:
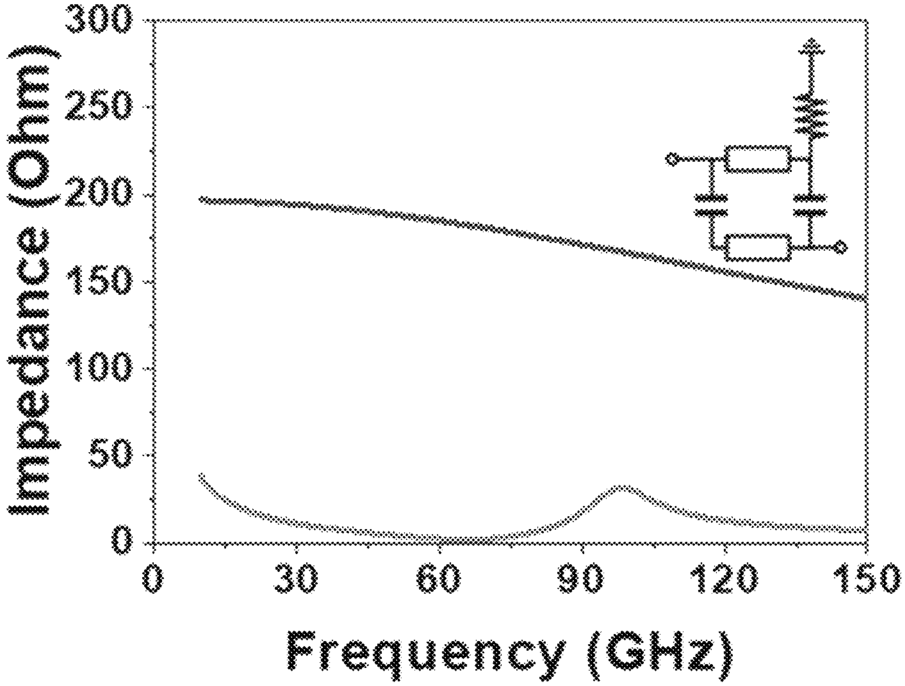
FIG. 5 is a diagram illustrating an impedance change in accordance with the matching circuit unit according to an embodiment of the present invention.
Figure 6:
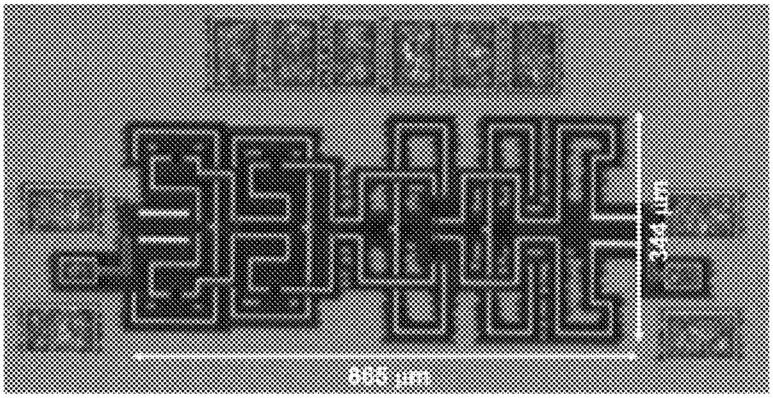
FIG. 6 is a diagram illustrating an amplifier chip actually implemented according to an embodiment of the present invention.
Figure 7:
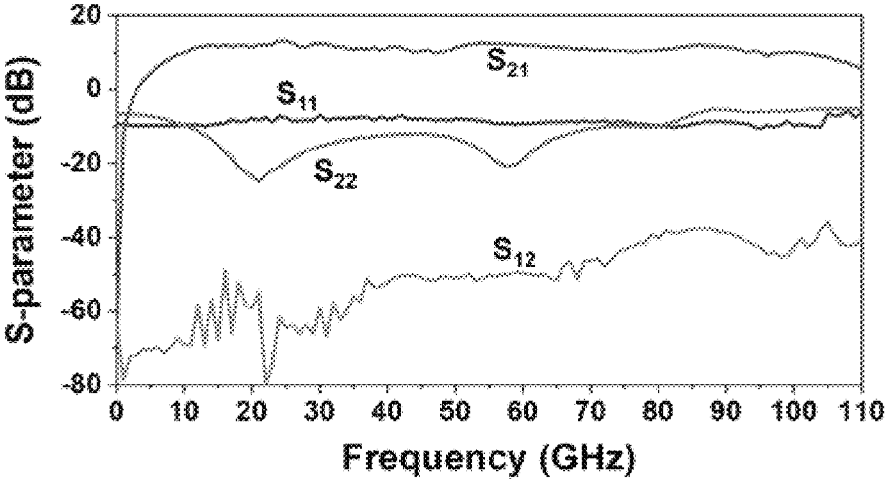
FIG. 7 is a diagram illustrating an amplifier measurement result according to an embodiment of the present invention.

FIG. 1 is a circuit diagram illustrating a broadband amplifier having a coupled line with a low resistance characteristic according to an embodiment of the present invention, FIG. 2 is a diagram illustrating a detailed configuration of a matching circuit unit according to an embodiment of the present invention, FIG. 3 is a diagram illustrating an impedance change when a resistance is connected to a coupled line according to an embodiment of the present invention, FIG. 4 is a diagram illustrating an impedance change when a capacitor is connected to the coupled line according to an embodiment of the present invention, FIG. 5 is a diagram illustrating an impedance change in accordance with the matching circuit unit according to an embodiment of the present invention, FIG. 6 is a diagram illustrating an amplifier chip actually implemented according to an embodiment of the present invention, and FIG. 7 is a diagram illustrating an amplifier measurement result according to an embodiment of the present invention.

Referring to FIG. 1, a broadband amplifier 100 according to an embodiment of the present invention is configured to include an input matching unit 110, an amplification unit 120, and an output matching unit 130.

As illustrated in FIG. 1, the broadband amplifier 100 according to an embodiment of the present invention may be a differential amplifier.

The input matching unit 110 is connected to two input terminals of the broadband amplifier 100 having a differential amplifier structure to perform input matching.

Since the amplifier 100 has the differential amplifier structure, the input matching unit 110 may be constituted by a first input matching circuit unit 110*a* and a second input matching circuit unit 110*b*. Here, the first input matching circuit unit 110*a* is connected to any one of two input terminals of the differential amplifier, and the second input matching circuit unit 110*b* is connected to the other one of two input terminals of the differential amplifier.

As illustrated in FIG. 1, an output port of the first input matching circuit unit 110*a* may be connected to a first input terminal, and an output port of the second input matching circuit unit 110*b* may be connected to a second input terminal.

Configurations of the first input matching circuit unit 110*a* and the second input matching circuit unit 110*b* are the same as each other. Therefore, the configuration of the matching circuit unit will be described in detail with reference to FIG. 2.

The first and second input matching circuit units 110*a* and 110*b* are configured to include a coupled line circuit unit 210 including a coupled line having a 4-port structure, a first impedance restriction circuit unit 220, and a second impedance restriction circuit unit 230.

The coupled line circuit unit 210 is configured by the coupled line having the 4-port structure. That is, the coupled line may be a metal line, and will be referred to and described as a first line 210*a* and a second line 210*b*.

An input port is connected to one end of the first line 210*a* and a through port is connected to the other end of the first line 210*a*.

Further, an isolation port is connected to one end of the second line 210*b* coupled to the first line 210*a*, and the output port is connected to the other end of the second line 210*b*.

Accordingly, an input signal is input through the input port of the first line 210*a*, and is impedance-matched, and then is output to an input terminal of the amplifier through the output port.

The first impedance restriction circuit unit 220 is connected to the through port connected to the other end of the first line 210*a*.

Here, the first impedance restriction circuit unit 220 may be configured by a resistance. That is, the resistance may be connected to the through ports of the coupled lines 210*a* and 210*b*.

The first impedance restriction circuit unit 220 serves as resistive matching in a low frequency band. As a result, an even mode impedance is limited to a value which is twice the resistance connected to the through port.

The characteristic resistance of the coupled line may be derived through a log average of an even mode impedance and an odd mode impedance as shown in Equation 1:

$$Z_{0coupler}(f)=\sqrt{Z_{0even}(f)Z_{0dd}(f)} \quad \text{[Equation 1]}$$

$$Z_{even}=\sqrt{\frac{L_s+L_m}{C_s}} \quad \text{[Equation 2]}$$

$$Z_{odd}=\sqrt{\frac{L_s-L_m}{C_s+2C_m}}$$

wherein, $L_s$ and $C_s$ represent unit-length inductance and capacitance of a single transmission line in the coupled line structure, respectively, and $L_m$ and $C_m$ represent mutual inductance and capacitance between two transmission lines, respectively.

The resistance is connected to the through port of the coupled lines 210*a* and 210*b* like the first impedance restriction circuit unit 220 to serve as the resistive matching in the low frequency band in the range of several GHz to dozens of GHZ, so the value which is twice the resistance value may serve as an upper limit of the even mode impedance.

When the resistance is connected to the coupled line and the through port of the coupled line, frequency dependency of the even mode impedance in which the frequency dependency is small may be significantly lower as illustrated in (a) of FIG. 3 compared with (b) of FIG. 3 configured only by the coupled line.

The second impedance restriction circuit unit 230 is connected between the coupled lines.

More specifically, as illustrated in FIG. 2, each capacitor may be located between each input port/output port and another neighboring port in the 4-port structure coupled line. That is, the input port and another neighboring port may be connected to a first capacitor, and the output port and another neighboring port may be connected to the second capacitor, respectively.

The input port of the first line 210*a* and the neighboring isolation port of the second line 210*b* may be connected to the first capacitor, and the through port of the first line 210*a* and the neighboring output port of the second line 210*b* may be connected to the second capacitor.

As shown in Equation 2, when a value of $C_m$; is adjusted, the odd mode impedance may be controlled without influencing the even mode impedance. A basic method of increasing the value of $C_m$ is to make the coupled lines be close to each other, but this is restricted by a design rule of a manufacturing company, and does not provide a value of $C_m$ which is enough to lower the odd mode impedance to almost several or tens of ohms.

Therefore, in an embodiment of the present disclosure, like the second impedance restriction circuit unit 230, the capacitors are connected between the input port and the output port of the coupled line, and other neighboring ports, respectively. As such, the connected capacitor has an effect of increasing a coupling capacitor $C_m$ of the coupled line. Accordingly, there is an advantage in that the odd mode impedance may lower without influencing the even mode impedance.

As illustrated in FIG. 4, the capacitor is connected between the coupled lines to lower the odd mode impedance to be close to dozens of ohms in a broadband range.

In FIG. 5, there is an advantage in that the resistance is connected to the through port of the coupled line, and the capacitor is connected between the coupled lines to lower the even mode impedance and the odd mode impedance, thereby obtaining wide matching characteristics.

In summary, according to an embodiment of the present invention, the input matching unit 110 is connected to each of two input terminals of the broadband amplifier 100 having the differential structure, and is configured by a 4-port coupled line, and the resistance is connected to the through port among 4 ports of the coupled line, and each capacitor is connected between the coupled lines to match the characteristic resistance of the coupled line in a wide frequency band as 50 ohms.

The amplification unit 120 is a means for amplifying the input signal passing through the input matching unit 110, and outputting the amplified input signal to an output terminal. In an embodiment of the present invention, it is assumed that the amplifier is configured in four stages, and this is primarily illustrated, but an amplifier structure is not particularly limited to four stages.

Further, a general configuration and a general function of the amplification unit 120 are irrelevant to a main argument of the present invention, so a detailed description thereof will be omitted.

The output matching unit 130 is a means which is connected to the output terminal of the amplification unit 120, and matches an output impedance. A basic structure of the output matching unit 130 is the same as that of the input matching unit 110.

The output matching unit 130 is the same as the input matching unit 110 in that the output matching unit 130 has the 4-port structure coupled line circuit unit, the first impedance restriction circuit unit, and the second impedance restriction circuit unit, but unlike the input matching unit 110, the output matching unit 130 is used for matching the signal output by the amplification unit 120, and is different from the input matching unit 110 in that the output terminal, and the input port of the output matching unit 130 are connected.

A basic structure a basic operation are the same as those of the input matching unit 110, so a redundant description will be omitted.

FIG. 6 is a diagram illustrating an amplifier chip actually implemented and FIG. 7 is a diagram illustrating an amplifier measurement result.

As illustrated in FIG. 7, it can be seen that broadband matching characteristics and gain characteristics are shown.

The present invention has been described above with reference to the embodiments thereof. It is understood to those skilled in the art that the present invention may be implemented as a modified form without departing from an essential characteristic of the present invention. Therefore, the disclosed embodiments should be considered in an illustrative viewpoint rather than a restrictive viewpoint. The scope of the present invention is defined by the appended claims rather than by the foregoing description, and all differences within the scope of equivalents thereof should be construed as being included in the present invention.

What is claimed is:

1. A matching circuit connected to each of an input terminal and an output terminal of an amplifier, the matching circuit comprising:

a coupled line circuit unit including coupled lines having a 4-port structure, wherein the coupled line includes a first metal line and a second metal line;

a first impedance restriction circuit unit electrically connected to a through port among 4 ports of the coupled lines and configured to restrict an even mode impedance in a low frequency band; and a second impedance restriction circuit unit electrically connected between the coupled lines and configured to restrict an odd mode impedance, wherein the first impedance restriction circuit unit comprises a resistance electrically connected to the through port, wherein the second impedance restriction circuit unit comprises a first capacitor and a second capacitor, wherein the first capacitor is electrically connected between an input port and an isolation port among the 4 ports, wherein the second capacitor is electrically connected between the through port and an output port among the 4 ports, and wherein the first capacitor and the second capacitor are configured to increase a coupling capacitance between the coupled lines to lower the odd mode impedance while substantially not affecting the even mode impedance.

2. The matching circuit of claim 1, wherein the first impedance restriction circuit unit comprises a resistance, and the resistance is connected to the through port.

3. A differential amplifier comprising:

a first input terminal and a second input terminal forming differential input terminals;

an amplification circuit unit configured to amplify signals received through the first input terminal and the second input terminals;

at least one output terminal configured to output signals amplified by the amplification circuit unit; and a plurality of matching circuit units connected to the first input terminal, the second input terminal, and the at least one output terminal, respectively, and configured to restrict input/output impedance, wherein each of the plurality of matching circuit units comprises:

a coupled line circuit unit including coupled lines having a 4-port structure, the coupled lines including a first metal line and a second metal line;

a resistance electrically connected to a through port among the 4 ports of the coupled lines and configured to restrict an even mode impedance in a low frequency band; and a first capacitor and a second capacitor electrically connected between the coupled lines and configured to restrict an odd mode impedance, wherein the first capacitor is electrically connected between an input port and an isolation port among the 4 ports, and wherein the second capacitor is electrically connected between the through port and an output port among the 4 ports, wherein the first capacitor and the second capacitor are configured to increase a coupling capacitance between the coupled lines to lower the odd mode impedance while substantially not affecting the even mode impedance.

* * * * *